(12) United States Patent  (10) Patent No.: US 8,039,309 B2
Murtuza et al.  (45) Date of Patent: Oct. 18, 2011

(54) SYSTEMS AND METHODS FOR POST-CIRCUITIZATION ASSEMBLY

(75) Inventors: Masood Murtuza, Sugar Land, TX (US); Satyendra Singh Chauhan, Sugar Land, TX (US); Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 292 days.

(21) Appl. No.: 12/116,459

(22) Filed: May 7, 2008

(65) Prior Publication Data

US 2008/0280394 A1  Nov. 13, 2008

Related U.S. Application Data

(60) Provisional application No. 60/928,572, filed on May 10, 2007.

(51) Int. Cl.
*H01L 21/00* (2006.01)
(52) U.S. Cl. ........ 438/109; 438/112; 438/113; 438/118; 438/124; 438/127
(58) Field of Classification Search .................. 438/107, 438/109, 112, 113, 118, 122, 124, 127, FOR. 386, 438/FOR. 405
See application file for complete search history.

(56) References Cited

U.S. PATENT DOCUMENTS

| 5,618,752 | A | * | 4/1997 | Gaul ............................. 438/626 |
| 5,976,769 | A | * | 11/1999 | Chapman ...................... 430/316 |
| 6,809,421 | B1 | * | 10/2004 | Hayasaka et al. ............. 257/777 |
| 2005/0186705 | A1 | * | 8/2005 | Jackson et al. ................ 438/106 |
| 2006/0012048 | A1 | | 1/2006 | Murai et al. |
| 2007/0262328 | A1 | * | 11/2007 | Bando ............................. 257/79 |
| 2009/0263936 | A1 | * | 10/2009 | Fujisawa et al. .............. 438/118 |
| 2010/0224890 | A1 | * | 9/2010 | Keller et al. .................... 257/93 |

FOREIGN PATENT DOCUMENTS

| JP | 09221375 A | 8/1997 |
| JP | 09307238 A | 11/1997 |
| JP | 2003282785 A | 10/2003 |

* cited by examiner

*Primary Examiner* — N Drew Richards
*Assistant Examiner* — Joannie A Garcia
(74) *Attorney, Agent, or Firm* — Yingsheng Tung; Wade J. Brady, III; Frederick J. Telecky, Jr.

(57) ABSTRACT

A method of making integrated circuit packages using a conductive plate as a substrate includes forming a partial circuit pattern on one side of the conductive plate by stamping or selectively removing a portion of the conductive plate through part of its thickness, and then electrically coupling semiconductor dies to the formed patterns on the conductive plate. The method further includes encapsulating at least a portion of the dies and the conductive plate with an encapsulant and removing a portion of the conductive plate from the side opposite the patterned side to form conductive traces based on the formed pattern.

20 Claims, 9 Drawing Sheets

SYSTEMS AND METHODS FOR POST-CIRCUITIZATION ASSEMBLY

RELATED APPLICATIONS

This application is related to and claims priority of Provisional Application No. 60/928,572 filed on May 10, 2007 and titled CSP-X3, the contents of which are fully incorporated herein by reference.

FIELD OF THE INVENTION

This invention relates generally to an integrated circuit package, and more particularly, to methods of assembling an integrated circuit package using a partially patterned conductive plate as a substrate.

DESCRIPTION OF THE RELATED ART

Many types of integrated circuit (IC) packaging are known in the art, and most use either a pin-grid array (PGA) or a ball-grid array (BGA) connection configuration to enable electrical connections to the packaged IC. A PGA-type IC package is typically a rectangular or square IC package with a high density of pins that enables it to support a large number of input/output from the packaged IC. In contrast, a BGA-type IC package typically uses a group of solder balls arranged in concentric rectangles or squares to enable electrical connections to the package IC, and are often used where the pins of a PGA-type IC package would take up too much space because of the length and size of the package pins.

Figure 1A:
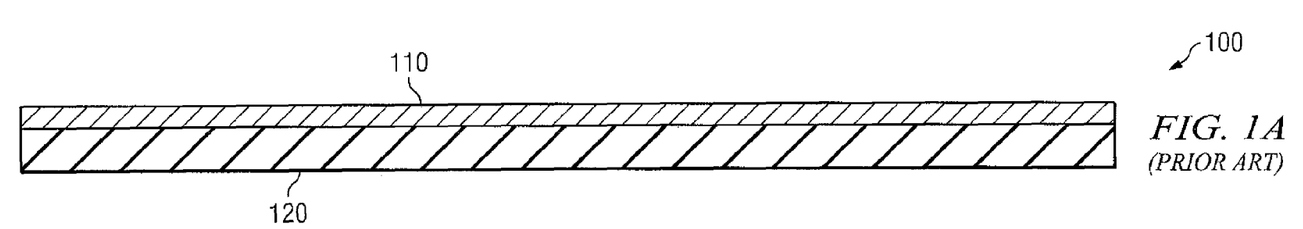
FIGS. 1A-F are side elevational views of an integrated circuit package being formed using a packaging process known in the art.
Figure 1B:
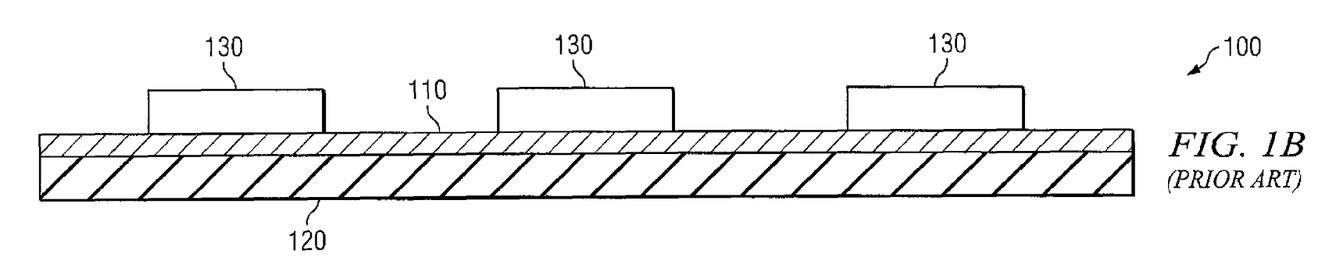
Figure 1C:
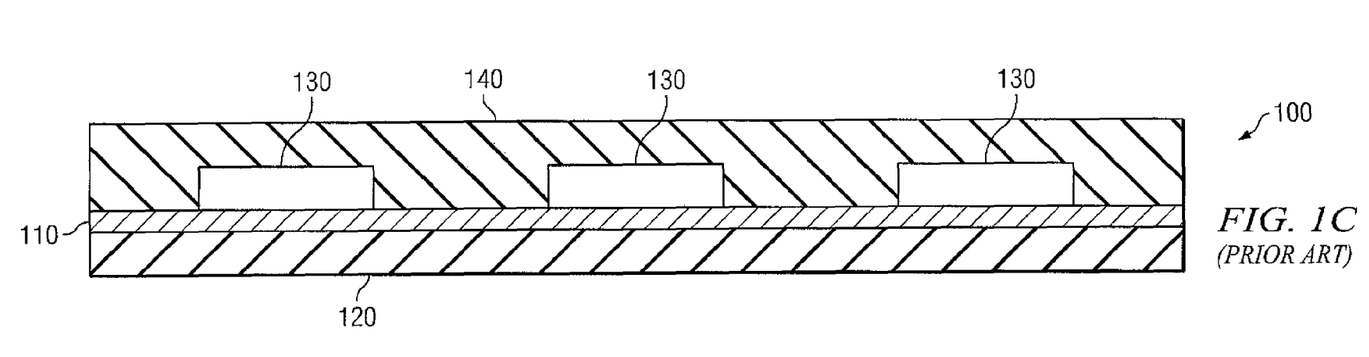
Figure 1D:
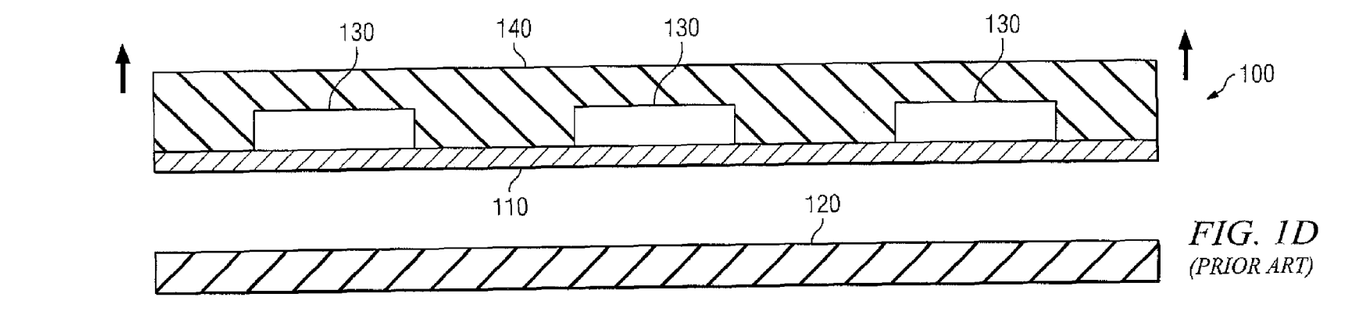
Figure 1E:
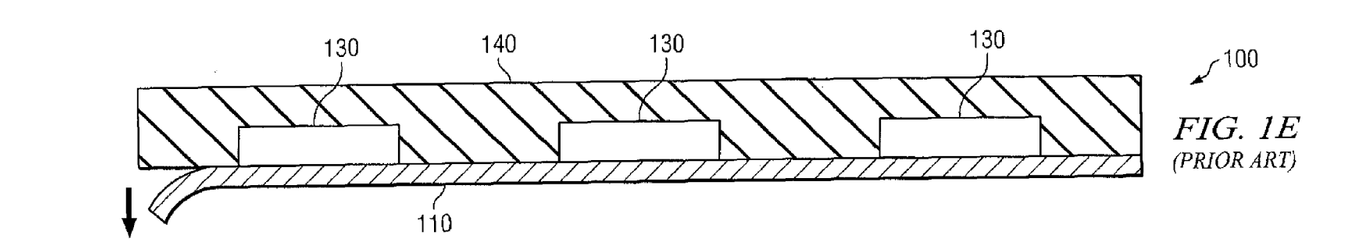
Figure 1F:
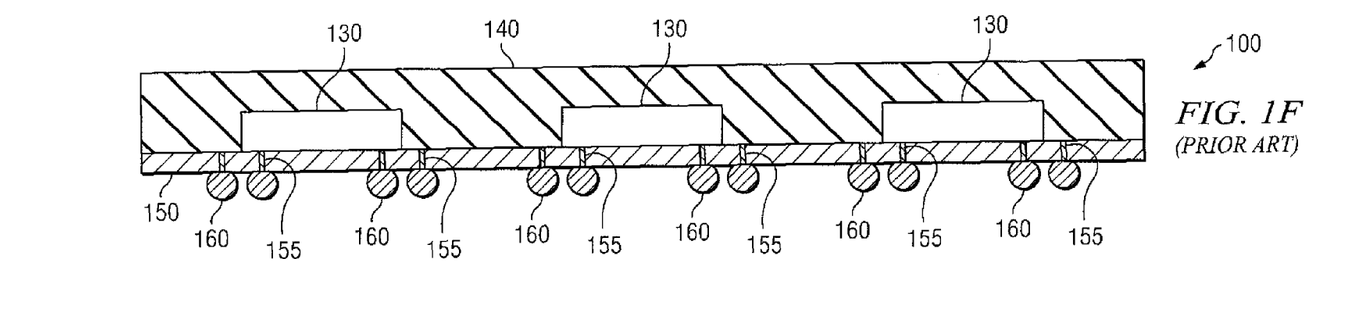

FIGS. 1A-F illustrate an existing process for making a BGA-type IC package 100. Referring to FIG. 1A, the process for making the BGA-type IC package 100 starts by laminating a metal carrier 120 with adhesive plastic tape 110. Next, as shown in FIG. 1B, semiconductor dies 130 are picked from a dicing frame and placed onto plastic tape 110. The dies 130 on the plastic tape 110 are encapsulated by a molding compound 140 as illustrated in FIG. 1C, and then the plastic tape 110, encapsulated dies 130, and molding compound 140 are released from the metal carrier 120 as illustrated in FIG. 1D. Next, the plastic tape 110 is peeled away from the encapsulated dies 130 and molding compound 140 as shown in FIG. 1E. Finally, as illustrated in FIG. 1F, the encapsulated dies 130 are deposited on and connected to a substrate layer 150 having solder balls 160 that are electrically connected to the encapsulated dies 130 through vias 155. The BGA-type IC package 100 as shown in FIG. 1F may be further processed, such as being divided or singulated into multiple IC packages.

In the view of the foregoing, there is a need for methods of making integrated circuit packages that does not require different substrates for different types and/or arrangement of semiconductor dies. Further, there is a need for methods of making integrated circuit packages that does not require the use of an adhesive plastic tape as a carrier for the semiconductor dies during the process of making the integrated circuit packages. Therefore, it is desirable that such methods reduce costs and simplify processing by using a conductive plate as a substrate.

SUMMARY OF THE INVENTION

Embodiments of the present invention relate generally to methods of making integrated circuit packages that use a conductive plate as a substrate. More particularly, a partial circuit pattern is formed on one side of the conductive plate by selectively removing a portion of the conductive plate through a part of its thickness, and then at least one semiconductor die is electrically coupled to the formed patterns on the conductive plate. Next, at least a portion of the die and the conductive plate is encapsulated with an encapsulant and a portion of the conductive plate is removed from the side opposite the patterned side to form conductive traces based on the formed pattern.

Using the conductive plate as the substrate for IC packaging results in cost savings from using an inexpensive material as the substrate and reducing the need for via-formation through the substrate, as well as lower inventory costs from using the same type of conductive plate as the substrate for different IC packages. Using the conductive plate as the substrate permits a finished IC package to be miniaturized because the substrate only needs to be the same size as or be incrementally larger than the die, the substrate may be stacked directly below or above the die, and the IC package may be stacked on top of another IC package. Using the conductive plate as the substrate also provides for better thermal management during packaging because the electrical and/or mechanical coupling of a die to the conductive plate provides for relatively high thermal dissipation from the die. Furthermore, using the conductive plate as the substrate allows for increased flexibility due to the capability to freely place one or more dies and other components within an IC package and to group one or more IC packages into a single module.

Additional embodiments will be set forth in part in the description which follows, and in part will be obvious from the description, or may be learned by practice of the disclosed embodiments. Embodiments will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention.

DETAILED DESCRIPTION

Reference will now be made in detail to the exemplary embodiments, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which may be practiced. These embodiments are described in sufficient detail to enable those skilled in the art to practice these embodiments and it is to be understood that other embodiments may be utilized and that changes may be made without departing from the scope of the invention. The following description is, therefore, merely exemplary.

Notwithstanding that the numerical ranges and parameters setting forth the broad scope of the exemplary embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 2:
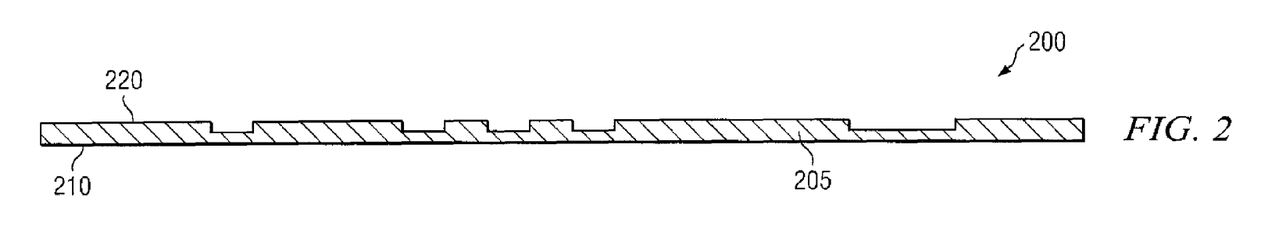
FIG. 2 is a side elevational view of a partial circuit pattern being formed on a conductive plate according to various embodiments of the invention.

FIG. 2 illustrates a side elevational view of a partial circuit pattern being formed on a conductive plate 205 that serves as a substrate for an integrated circuit (IC) packager in accordance with an exemplary embodiment of the invention. Conductive plate 205, which has side one 210 and side two 220, may be a rigid or semi-rigid copper (Cu) plate or copper-alloy plate. Conductive plate 205 may be individually transported or continuously fed to a patterning and/or etching device, a die mounting device, a molding device, or other devices from a stack of plates, an extruder, a continuous roll of material, or the like.

Figure 7A:
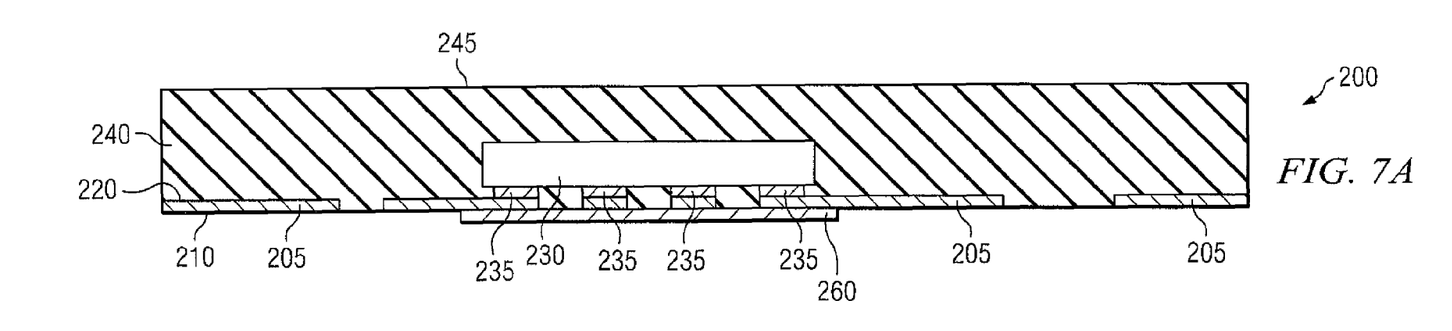
FIG. 7A is a side elevational view of a metal web being formed from the partially fabricated device of FIG. 4 according to various embodiments of the invention.
Figure 7B:
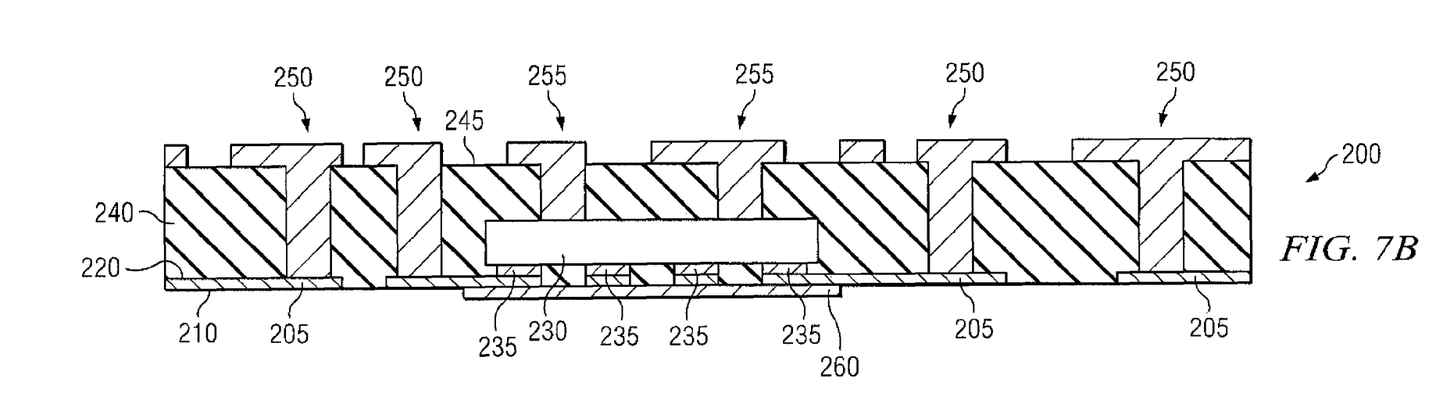
FIG. 7B is a side elevational view of a metal web being formed from the partially fabricated device of FIG. 6 according to various embodiments of the invention.

Prior to die mounting, conductive plate 205 of a partially fabricated device 200 is patterned on side two 220, as shown in FIG. 2. Before, during, or after patterning, conductive plate 205 may be plated with nickel (Ni), palladium (Pd), and/or other conductive material or materials known in the art to facilitate etch stop, enhance solderability, and modify other properties of conductive plate 205 as desired. Conductive plate 205 may be patterned, or have material selectively removed, through part of its thickness using photolithography, etching, polishing, grinding, or other processes known in the art, to form a metal web of conductive traces and connections from conductive plate 205 as shown in FIGS. 7A and 7B and described hereinafter. Conductive plate 205 may also be patterned using embossing processes such as stamping and/or heat embossing.

Figure 10:
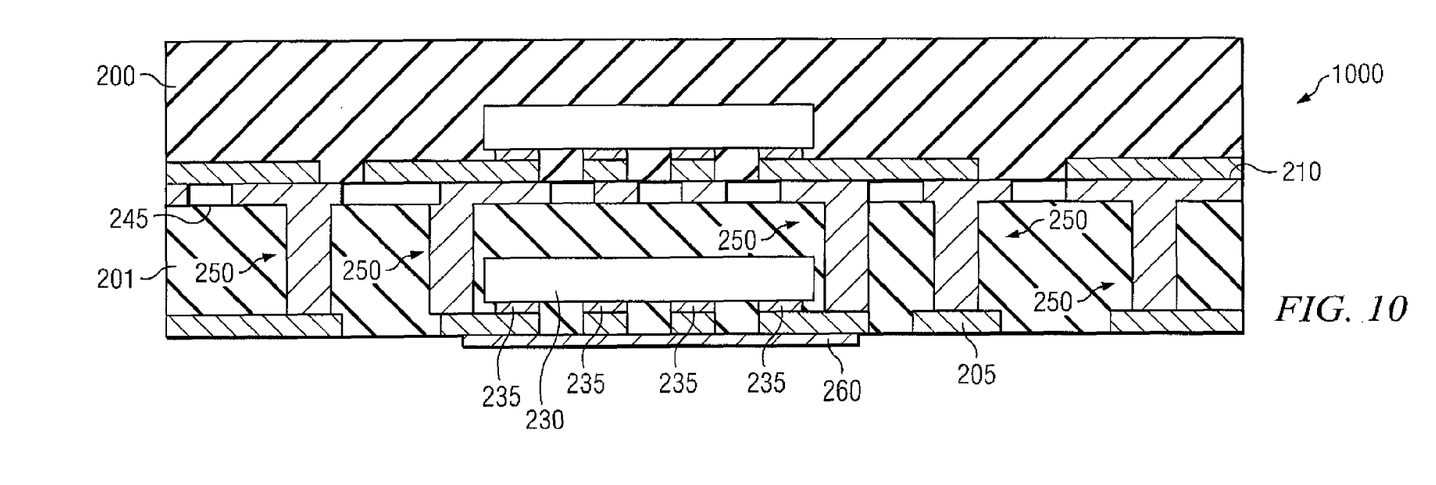
FIG. 10 is a side elevational view of a stack of partially fabricated devices according to various embodiments of the invention.

Using conductive plate 205 as the substrate for IC packaging has many advantages, which include but are not limited to cost savings from using an inexpensive material as the substrate and reducing the need for via-formation through the substrate, as well as lower inventory costs from using the same type of conductive plate as the substrate for different IC packages. Another advantage includes miniaturization of a finished IC package because the substrate only needs to be the same size as or incrementally larger than the die, the substrate may be stacked directly below or above the die, and the IC package may be stacked on top of another IC package, an exemplary embodiment of which is shown in FIG. 10. Using conductive plate 205 as the substrate also provides for better thermal management during packaging because the electrical and/or mechanical coupling of a die 230 to conductive plate 205, exemplary embodiments of which are shown in FIGS. 3-6 and described hereinafter, provides for relatively high thermal dissipation from die 230. Furthermore, using conductive plate 205 as the substrate allows for increased flexibility due to the capability to freely place one or more dies and other components within an IC package and to group one or more IC packages into a single module as illustrated in, for example, FIG. 11.

Figure 3:
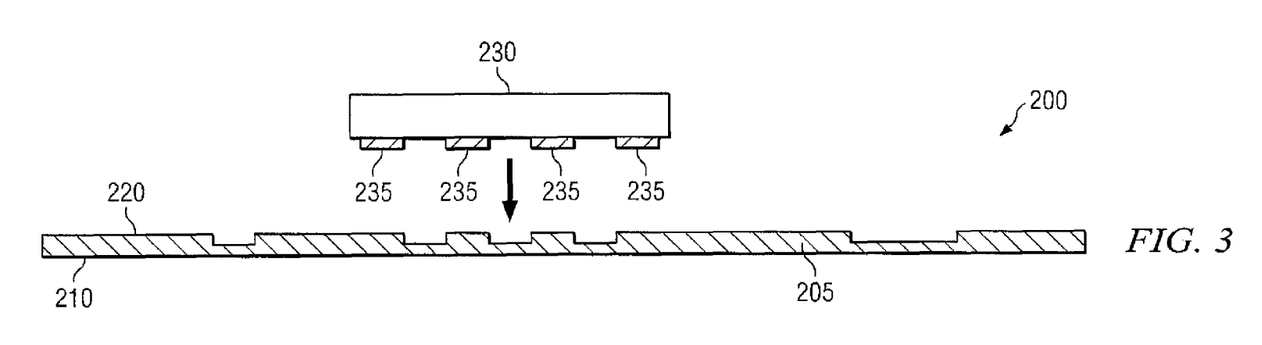
FIG. 3 is a side elevational view of a die being mounted to the partially patterned conductive plate of FIG. 2 according to various embodiments of the invention.

FIG. 3 shows a side elevational view of die 230 being mounted onto patterned conductive plate 205 of FIG. 2 in accordance with an exemplary embodiment of the invention. For illustration purposes, a single die is shown in FIG. 3, but multiple dies may be mounted onto conductive plate 205 simultaneously or sequentially in a manner consistent with embodiments of the invention. Die 230 may be fabricated using any suitable semiconductor material or other non-conventional base materials upon which or within which electronic components may be formed, such as but not limited to silicon (Si), germanium (Ge), silicon germanium (SiGe), gallium arsenide (GaAs), indium arsenide (InAs), aluminum gallium arsenide (AlGaAs), silicon carbide (SiC), or the like. Die 230 also includes various electronic components (not shown) formed in the semiconductor material, conductive paths, and dielectrics for isolating the conductive paths as is known in the art.

Die 230 may be mounted using die mounting processes known in the art, such as flip chip assembly, adhesives, and/or wire bonding. For illustration purposes, FIG. 3 shows die 230 being mounted onto side two 220 of conductive plate 205 using a flip chip assembly process, also known in the art as controlled collapse chip connection. During the flip chip assembly process, die 230 is patterned with small attachment pads 235 of metal (e.g., solder, solder paste, and the like) that serve as connections to conductive plate 205. Attachment pads 235 are metalized to make them more suitable for attaching to conductive plate 205, in which a small dot of metal is deposited on each of the pads. In lieu of wire bonds or other types of external connectors, attachment pads 235 are used to electrically and/or mechanically couple die 230 directly to conductive plate 205. Die 230 is then transported and may be inverted to align attachment pads 235 onto partially patterned conductive traces on side two 220 of conductive plate 205.

Figure 8A:
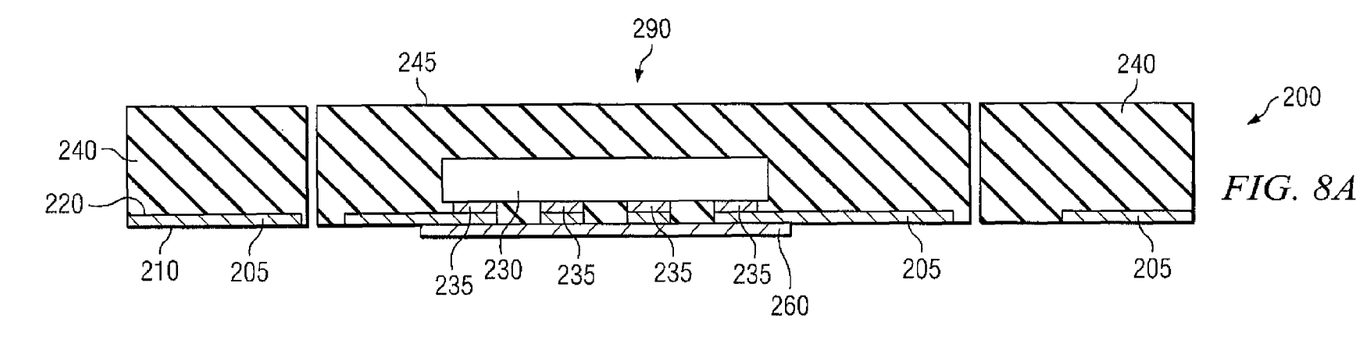
FIG. 8A is a side elevational view of a singulation process being performed on the partially fabricated device of FIG. 7A according to various embodiments of the invention.
Figure 8B:
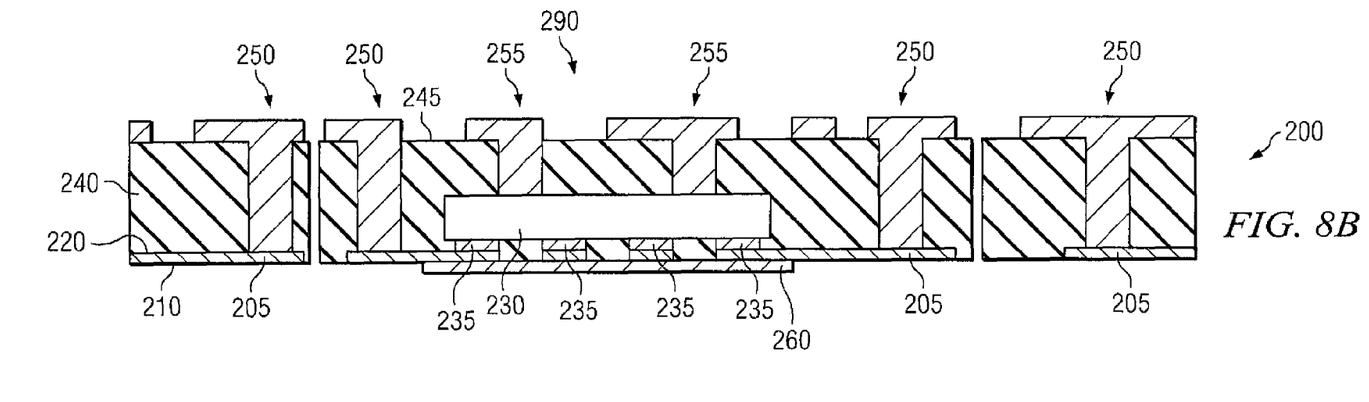
FIG. 8B is a side elevational view of a singulation process being performed on the partially fabricated device of FIG. 7B according to various embodiments of the invention.

The metal dots on attachment pads 235 are melted to produce an electrical connection between die 230 and conductive plate 205. Location of die 230 may be marked on side one 210 of conductive plate 205 as a reference marker for further processing, such as singulation of partially fabricated device 200 as illustrated in FIGS. 8A and 8B and described hereinafter. In some cases, the flip chip assembly process leaves a small space between die 230 and conductive plate 205, in which an electrically-insulating adhesive or thermal paste may be used to underfill the space to provide a stronger mechanical connection, enhance heat dissipation, and minimize stress on attachment pads 235 caused by differential heating of die 230 and the rest of the IC package. Moreover, the process of flip chip assembly eliminates the need for wire bonds and mechanical carriers, which decreases the profile of the IC package and thus resulting in further miniaturization.

Figure 4:
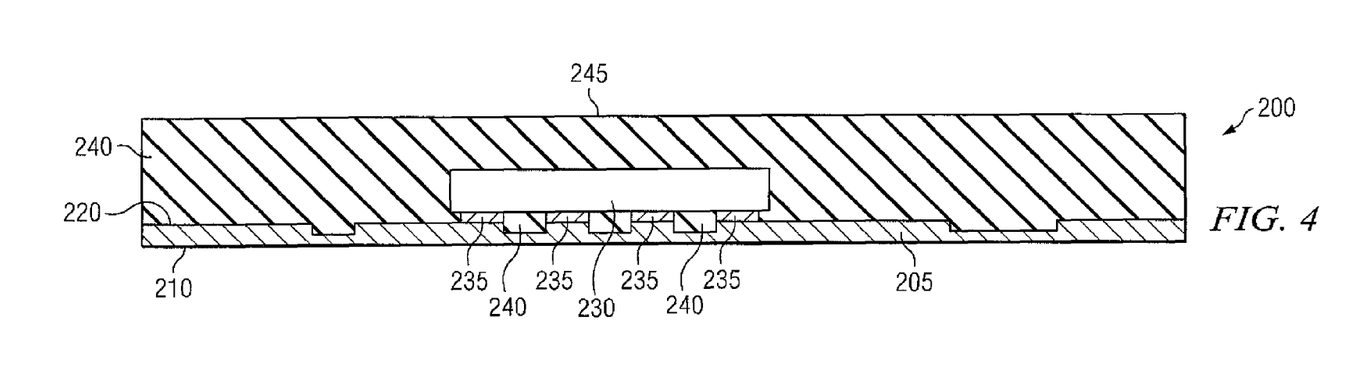
FIG. 4 is a side elevational view of a molding process being performed on a partially fabricated device of FIG. 3 according to various embodiments of the invention.
Figure 5:
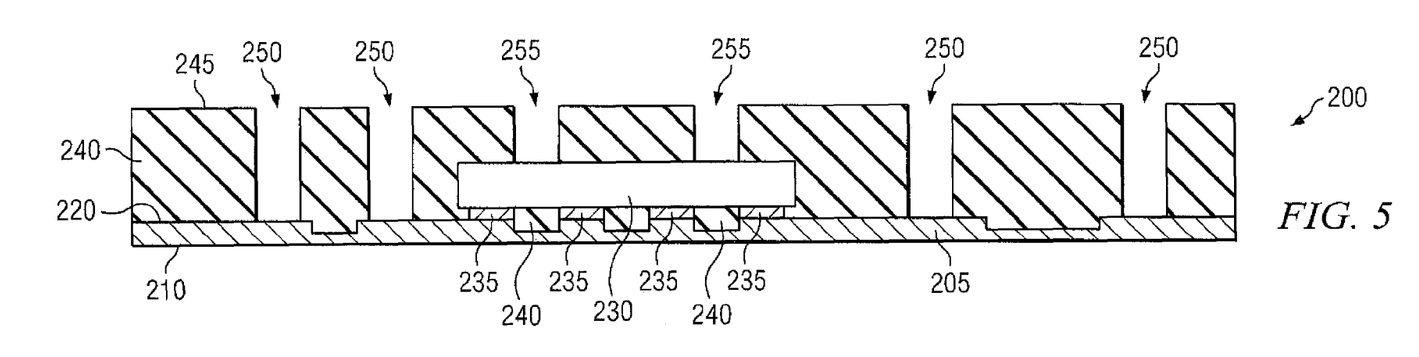
FIG. 5 is a side elevational view of vias being formed in the partially fabricated device of FIG. 4 according to various embodiments of the invention.
Figure 6:
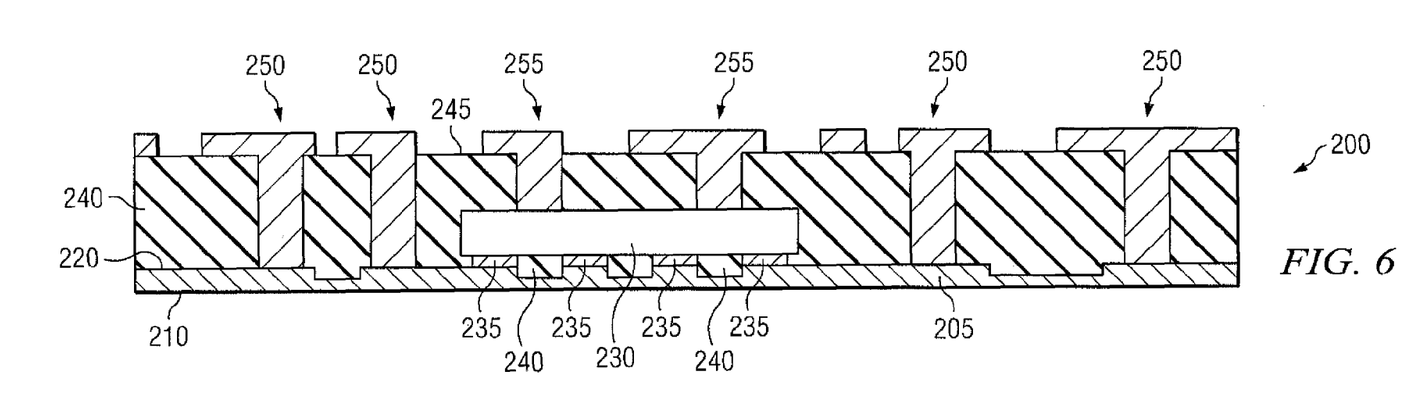
FIG. 6 is a side elevational view of a conductive material being deposited and patterned on the partially fabricated device of FIG. 5 according to various embodiments of the invention.

FIG. 4 illustrates a molding process being performed on partially fabricated device 200 of FIG. 3 in accordance with an exemplary embodiment of the invention. An encapsulant 240, which may be made of epoxy, epoxy resin compound, or other encapsulating material known in the art, is molded around at least a portion of die 230, attachment pads 235, and side two 220 of conductive plate 205. Preferably, encapsulant 240 exhibits high strength and low shrinkage during curing, and protects die 230, attachment pads 235, and the electrical connections between die 230 and conductive plate 205 when encapsulant 240 is sufficiently cured and hardened. After the molding process is complete, additional conductive layers and connections may be added on a surface 245 of encapsulant 240, exemplary embodiments of which are shown in FIGS. 5 and 6. If no additional layers are required, partially fabricated device 200 of FIG. 4 is processed to form conductive traces as shown in FIG. 7A.

FIG. 5 shows a side elevational view of vias 250 and thermal vias 255 being formed in partially fabricated device 200 of FIG. 4 in accordance with an exemplary embodiment of the invention. Vias 250 and thermal vias 255 may be formed by chemical or mechanical reaming, drilling, milling, or the like. For illustration purposes, vias 250 and thermal vias 255 are shown in FIGS. 5, 6, 7B, 8B, and 10 as blind vias. In other embodiments consistent with the invention, vias 250 and thermal vias 255 may also be through holes, buried vias, or the like.

Next, as illustrated in FIG. 6, a conductive material is deposited on surface 245, vias 250, and thermal vias 255 and patterned on partially fabricated device 200 of FIG. 5 in accordance with an exemplary embodiment of the invention. The conductive material may be copper, gold, silver, aluminum, copper alloys, or other suitable electrical and/or thermal conductors, and deposited on surface 245, vias 250, and thermal vias 255 by sputtering, chemical deposition, or other deposition methods known in the art. The conductive material may then be patterned to form conductive traces on encapsulant surface 245 using photolithography, etching, stamping, embossing, grinding, polishing, or other processes known in the art. The patterned conductive traces on encapsulant surface 245 provides exposed connectors that may be aligned with and connected to the conductive traces of overlaying IC packages to form a stack 1000 as shown in FIG. 10 and described hereinafter. After patterning, encapsulant surface 245 and/or the conductive traces thereon may be further processed, such as coating with solder, solder resist and/or mask, thermal paste, adhesive, and the like.

FIG. 7A is a side elevational view of a metal web being formed by removing material from side one 210 of conductive plate 205 of partially fabricated device 200 of FIG. 4 in accordance with an exemplary embodiment of the invention. FIG. 7B is a side elevational view of a metal web being formed by removing material from side one 210 of conductive plate 205 of partially fabricated device 200 of FIG. 6 also in accordance with an exemplary embodiment of the invention. Prior to forming the metal web of conductive traces and connections, conductive plate 205 (as shown in FIGS. 7A and 7B) may be patterned on side one 210 to form additional conductive traces and connections. Formation of the metal web may be accomplished by etching, polishing, grinding, or otherwise removing an amount of material from side one 210 sufficient to form conductive traces and/or connections previously patterned onto side two 220 and/or side one 210 of conductive plate 205. The amount of material removed may be predetermined and/or based on measurements of the characteristics (e.g., mass, conductivity, thickness, and the like) of partially fabricated device 200 or parts thereof made during fabrication. As shown in FIGS. 7A and 7B, after the metal web is formed, a layer of solder mask 260 may be screened onto side one 210 of partially fabricated device 200 to protect the formed conductive traces and/or connections.

Figure 8C:
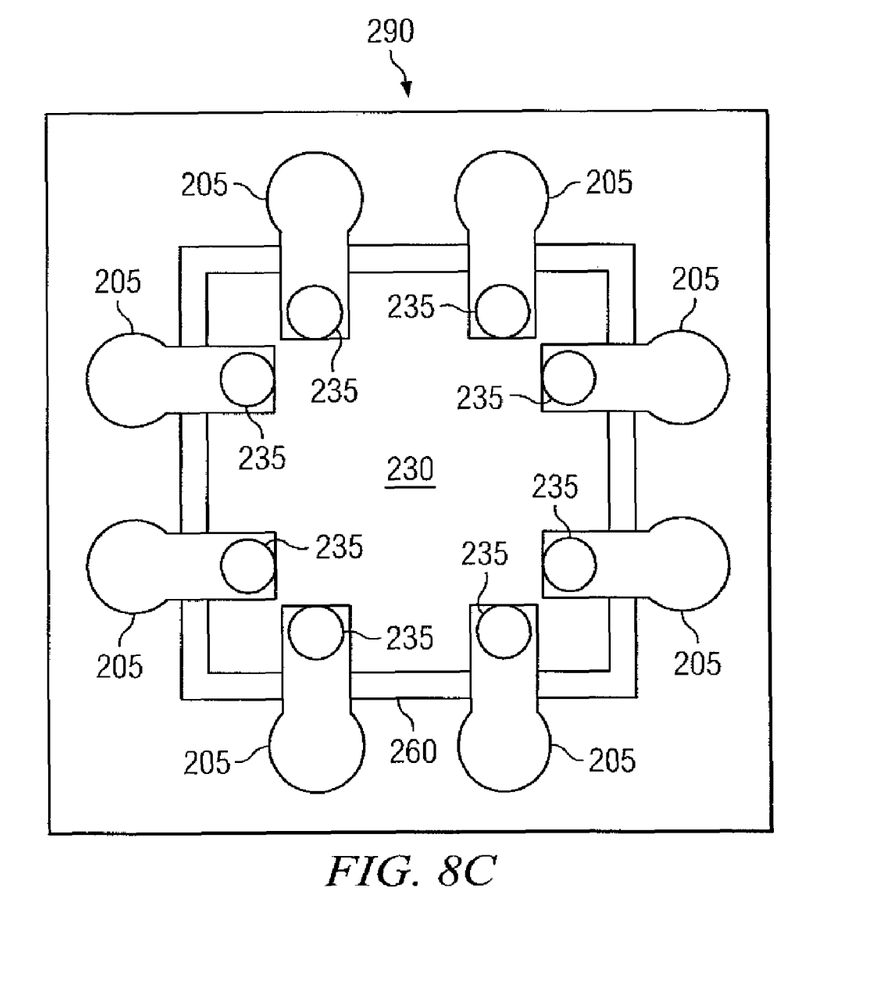
FIG. 8C is a top plan view of an integrated circuit package formed according to various embodiments of the invention.

FIG. 8A illustrates an IC package 290 formed by singulating (e.g., dividing, partitioning, and the like) partially fabricated device 200 of FIG. 7A in accordance with an exemplary embodiment of the invention. FIG. 8B illustrates an IC package 290 formed by singulating partially fabricated device 200 of FIG. 7B also in accordance with an exemplary embodiment of the invention. FIG. 8C illustrates a top plan view of IC package 290 formed by singulating partially fabricated device 200 of FIG. 7A or FIG. 7B in accordance with various embodiments of the invention. The singulation process may be performed by chemical, mechanical, or laser cutting, sawing, punching, slicing, stamping, and the like. For illustration purposes, FIGS. 8A-C each illustrates one IC package 290, but multiple IC packages or modules of IC packages may be simultaneously or sequentially singulated from partially fabricated device 200 of FIG. 7A or FIG. 7B, or from stack 1000 of partially fabricated devices as shown in FIG. 10, in a manner consistent with various embodiments of the invention.

Figure 9:
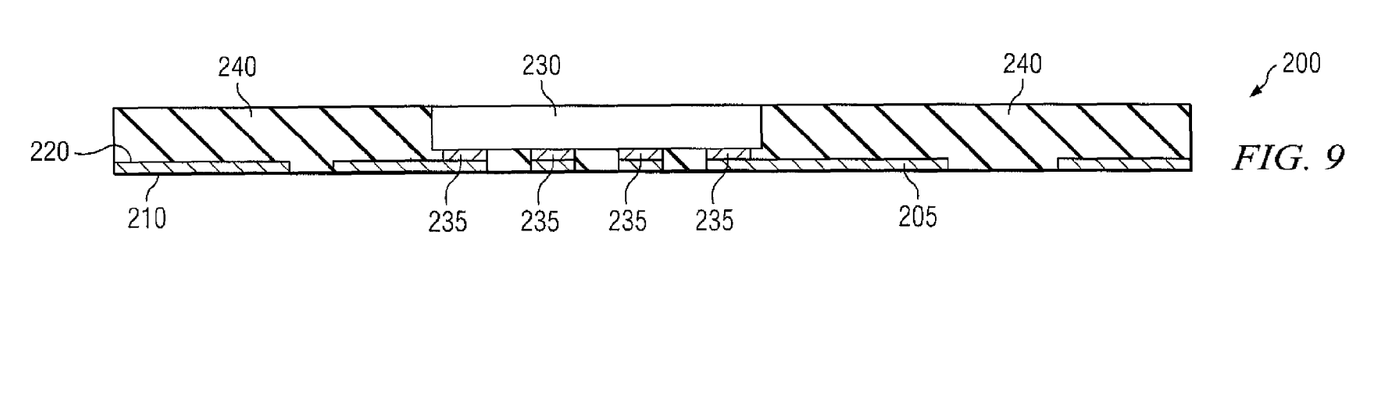
FIG. 9 is a side elevational view of the partially fabricated device having an exposed die according to various embodiments of the invention.

FIG. 9 is a side elevational view of partially fabricated device 200 in which die 230 has an exposed surface 250 not encapsulated by encapsulant 240, in accordance to various embodiments of the invention. Having exposed surface 250 may enhance thermal management of the IC package, decrease the profile of the IC package, and/or permit visual identification of die 230. Exposed surface 250 may be covered by an optically transparent and/or thermally conductive compound or a thermal sensor to prevent contaminants from coming in contact with die 230 and/or enhance thermal management of the IC package.

FIG. 10 is a side elevational view of stack 1000 of partially fabricated top and bottom devices 200 and 201, respectively, in accordance with an exemplary embodiment of the invention. Conductive material is deposited on surface 245 and vias 250 of bottom device 201 and patterned into conductive traces as shown in FIG. 6, and material on side one 210 of top device 200 is removed to form a metal web of conductive traces and connections as shown in FIG. 7. The conductive traces on side one 210 of top device 200 may then be aligned with and connected to the conductive traces on surface 245 of bottom device 201 to form stack 1000. Stack 1000 may be further stacked with additional IC packages and is not limited to the exemplary embodiment illustrated in FIG. 10.

Figure 11:
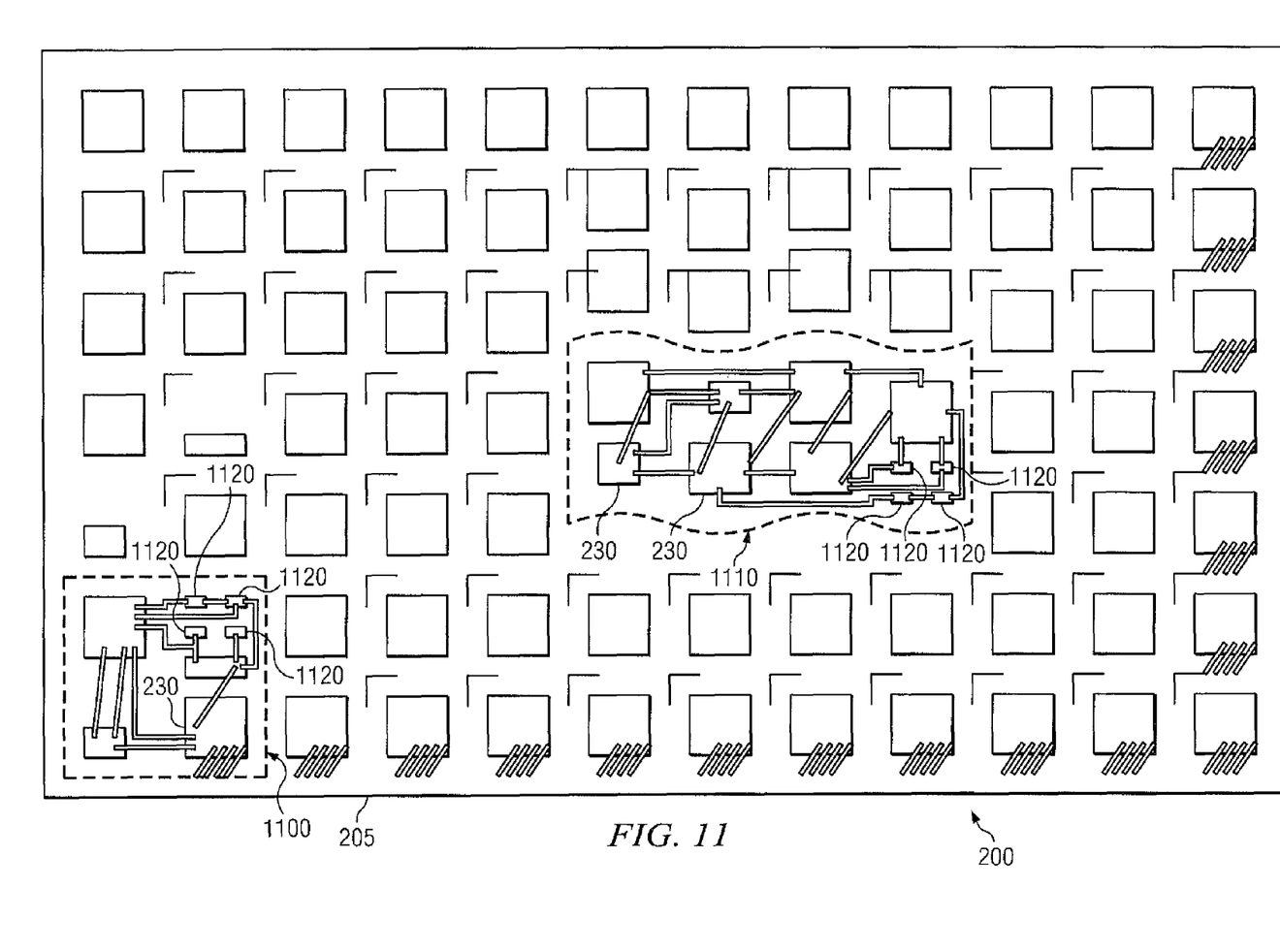
FIG. 11 is a top plan view of a partially fabricated device being singulated into packages and modules according to various embodiments of the invention.

FIG. 11 is a top plan view of partially fabricated device 200 being singulated into packages and modules in accordance with an exemplary embodiment of the invention. As shown in FIG. 11, partially fabricated device 200 may have modules 1100 and 1110 that each includes one or more dies 230 and circuit components 1120 of various sizes. Singulating modules (e.g., modules 1100 and 1110) from partially fabricated device 200 is straightforward because using conductive plate 205 as the substrate provides for greater flexibility to freely place dies 230 and/or components 1120 of various sizes anywhere on conductive plate 205 and to group any number of dies 230 and/or components 1120 into one or more modules of various sizes and shapes. For example, the modules may have geometric shapes (e.g., module 1100) or non-geometric shapes (e.g., module 1110).

In accordance with various embodiments as described above, prior to mounting and molding dies 230 and/or components 1120 onto conductive plate 205, conductive plate 205 may be patterned, or have material selectively removed through part of its thickness, to form partial patterns. The partial patterns serve as the basis from which conductive traces and/or connections are formed, including those between dies 230 and components 1120 in modules 1100 and 1110 as shown in FIG. 11. For example, after dies 230 and components 1120 are mounted and/or molded onto patterned conductive plate 205, an amount of material may be removed from patterned conductive plate 205 to form a metal web of conductive traces and/or connections based on the partial pattern. Partially fabricated device 200 having conductive plate 205 that includes modules 1100 and 1110 may also be further processed as described above in accordance with various embodiments.

Other embodiments of the present teaching will be apparent to those skilled in the art from consideration of the specification and practice of the exemplary embodiments disclosed herein. It is intended that the specification and examples be considered as exemplary only, with a true scope and spirit of the invention being indicated by the following claims.

What is claimed is:

1. A method of making integrated circuit packages using a conductive plate as a substrate, the method comprising:

forming a pattern on one of two sides of a single-piece conductive plate, wherein the pattern is formed partially through a thickness of the conductive plate;

electrically coupling one or more semiconductor dies to a surface on the patterned side of the conductive plate;

encapsulating at least a portion of the dies and a portion of the conductive plate with an encapsulant over the patterned side of the conductive plate; and removing a portion of the encapsulated conductive plate from the side opposite the patterned side to form first conductive traces based on the formed pattern.

2. The method of claim 1, further comprising: singulating the encapsulated conductive plate to form a plurality of integrated circuit packages each having at least one of the dies.

3. The method of claim 2, wherein the singulated integrated circuit packages are of varying sizes.

4. The method of claim 2, wherein at least one of the singulated integrated circuit packages is of a non-geometric shape.

5. The method of claim 2, wherein at least one of the singulated integrated circuit packages includes at least two of the dies.

6. The method of claim 1, further comprising:

forming one or more vias at least partially through the encapsulant;

depositing a conductive material in the vias and in a layer on a surface of the encapsulant opposite the encapsulated conductive plate; and patterning the conductive material layer on the encapsulant surface to form second conductive traces.

7. The method of claim 6, further comprising: stacking one or more components on the encapsulant surface of the encapsulated conductive plate, wherein the components are electrically coupled to the second conductive traces of the encapsulated conductive plate.

8. The method of claim 7, wherein the components include an integrated circuit package having at least one semiconductor die.

9. The method of claim 1, wherein forming a pattern further comprises selectively removing a portion of the conductive plate by performing one of photolithography, etching, polishing, and grinding.

10. The method of claim 1, wherein forming a pattern further comprises forming a pattern on the conductive plate by performing one of stamping and embossing.

11. The method of claim 1, wherein the conductive plate is one of a copper plate and a copper-alloy plate.

12. The method of claim 1, wherein electrically coupling the semiconductor dies further comprises:

aligning attachment pads of the semiconductor dies to the pattern on the patterned side of the conductive plate: and electrically coupling the dies to the conductive plate by melting a metal on the attachment pads while in alignment with the conductive plate.

13. The method of claim 1, further comprising:

marking a location of the dies on the side of the conductive plate opposite the patterned side; and singulating, based on the marked location, the conductive plate to form one or more integrated circuit packages each having at least one of the dies.

14. The method of claim 1, wherein an upper surface of at least one of the dies opposite the encapsulated conductive plate is exposed after the encapsulating step.

15. The method of claim 1, wherein the conductive plate is fed from one of a stack of conductive plates, an extruder, and a continuous roll of conductive material.

16. An integrated circuit package formed in accordance with the method of claim 1.

17. A method of making integrated circuit packages using a copper plate as a substrate, the method comprising:

forming a pattern on one of two sides of a single-piece copper plate, wherein the pattern is formed partially through a thickness of the copper plate;

electrically coupling one or more semiconductor dies to a surface on the patterned side of the copper plate;

encapsulating at least a portion of the dies and a portion of the copper plate with an encapsulant over the patterned side of the copper plate; and removing a portion of the encapsulated copper plate from the side opposite the patterned side to form first conductive traces based on the formed pattern.

18. The method of claim 17, further comprising: singulating the encapsulated copper plate to form integrated circuit packages each having at least one of the dies, wherein the dies are of varying sizes.

19. The method of claim 17, further comprising: singulating the encapsulated copper plate to form integrated circuit packages each having at least one of the dies, wherein the integrated circuit packages are singulated into varying sizes.

20. The method of claim 17, further comprising:

forming one or more vias at least partially through the encapsulant;

depositing a conductive material in the vias and in a layer on a surface of the encapsulant opposite the encapsulated copper plate;

patterning the conductive material layer on the encapsulant surface to form second conductive traces, wherein the second conductive traces are electrically connected to the first conductive traces through at least one of the vias; and stacking at least one encapsulated semiconductor die on the encapsulant surface of the encapsulated copper plate, wherein the encapsulated semiconductor die is electrically coupled to the second conductive traces of the encapsulated copper plate.

* * * * *